United States Patent
He et al.

(10) Patent No.: US 9,235,134 B2
(45) Date of Patent: Jan. 12, 2016

(54) LENS HEATING COMPENSATION IN PHOTOLITHOGRAPHY

(75) Inventors: Yuan He, Boise, ID (US); Kaveri Jain, Boise, ID (US); Lijing Gou, Boise, ID (US); Zishu Zhang, Boise, ID (US); Anton deVilliers, Boise, ID (US); Michael Hyatt, Boise, ID (US); Jianming Zhou, Boise, ID (US); Scott Light, Boise, ID (US); Dan Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1056 days.

(21) Appl. No.: 12/857,316

(22) Filed: Aug. 16, 2010

(65) Prior Publication Data

US 2012/0038895 A1 Feb. 16, 2012

(51) Int. Cl.
*G03B 27/42* (2006.01)
*G03F 7/20* (2006.01)

(52) U.S. Cl.
CPC ........ *G03F 7/70116* (2013.01); *G03F 7/70891* (2013.01)

(58) Field of Classification Search
CPC ............ G03F 7/70891; G03F 7/70116; G03F 7/70075; G03F 7/701; G03F 7/7025; G03F 7/70158; G03F 7/70183; G03F 7/70108
USPC .............................. 355/30, 53, 55, 63, 67, 77
See application file for complete search history.

(56) References Cited

U.S. PATENT DOCUMENTS

| | | | |
|---|---|---|---|
| 5,345,292 A * | 9/1994 | Shiozawa et al. | 355/67 |
| 2003/0160949 A1* | 8/2003 | Komatsuda et al. | 355/71 |
| 2010/0157269 A1* | 6/2010 | Deguenther et al. | 355/67 |
| 2010/0173236 A1* | 7/2010 | Yasunobe et al. | 430/30 |

\* cited by examiner

*Primary Examiner* — Mesfin T Asfaw
(74) *Attorney, Agent, or Firm* — Schwegman Lundberg & Woessner, P.A.

(57) ABSTRACT

Photolithographic apparatus and methods are disclosed. One such apparatus includes an optical path configured to provide a first diffraction pattern in a portion of an optical system and to provide a second diffraction pattern to the portion of the optical system after providing the first diffraction pattern. Meanwhile, one such method includes providing a first diffraction pattern onto a portion of an optical system, wherein a semiconductor article is imaged using the first diffraction pattern. A second diffraction pattern is also provided onto the portion of the optical system, but the second diffraction pattern is not used to image the semiconductor article.

21 Claims, 6 Drawing Sheets

LENS HEATING COMPENSATION IN PHOTOLITHOGRAPHY

BACKGROUND

Photolithography is widely used in the fabrication of semiconductor devices. Briefly, and in general terms, an optical path, such as one including an illumination source and a patterning tool (e.g., a mask or reticle), and a projection optical system ("POS") are used to provide patterned radiation onto a semiconductor material or material formed on semiconductor material, such as to form features of a device. The resolution and focus of the patterned radiation receive greater attention as feature size and line widths continue to decrease.

BRIEF DESCRIPTION OF THE DRAWINGS

Various embodiments are described in detail in the discussion below and with reference to the following drawings.

DETAILED DESCRIPTION

Various embodiments include photolithographic apparatuses that at least partially compensate for the adverse effects of lens heating, and methods for reducing the adverse effects of lens heating in photolithographic processes. Many specific details of various embodiments are set forth in the following description and in FIGS. 1 through 7 to provide a thorough understanding of such embodiments. One of ordinary skill in the art, however, will understand that additional embodiments are possible, and that many embodiments may be practiced without making use of several of the details presented in the following description.

Figure 1:
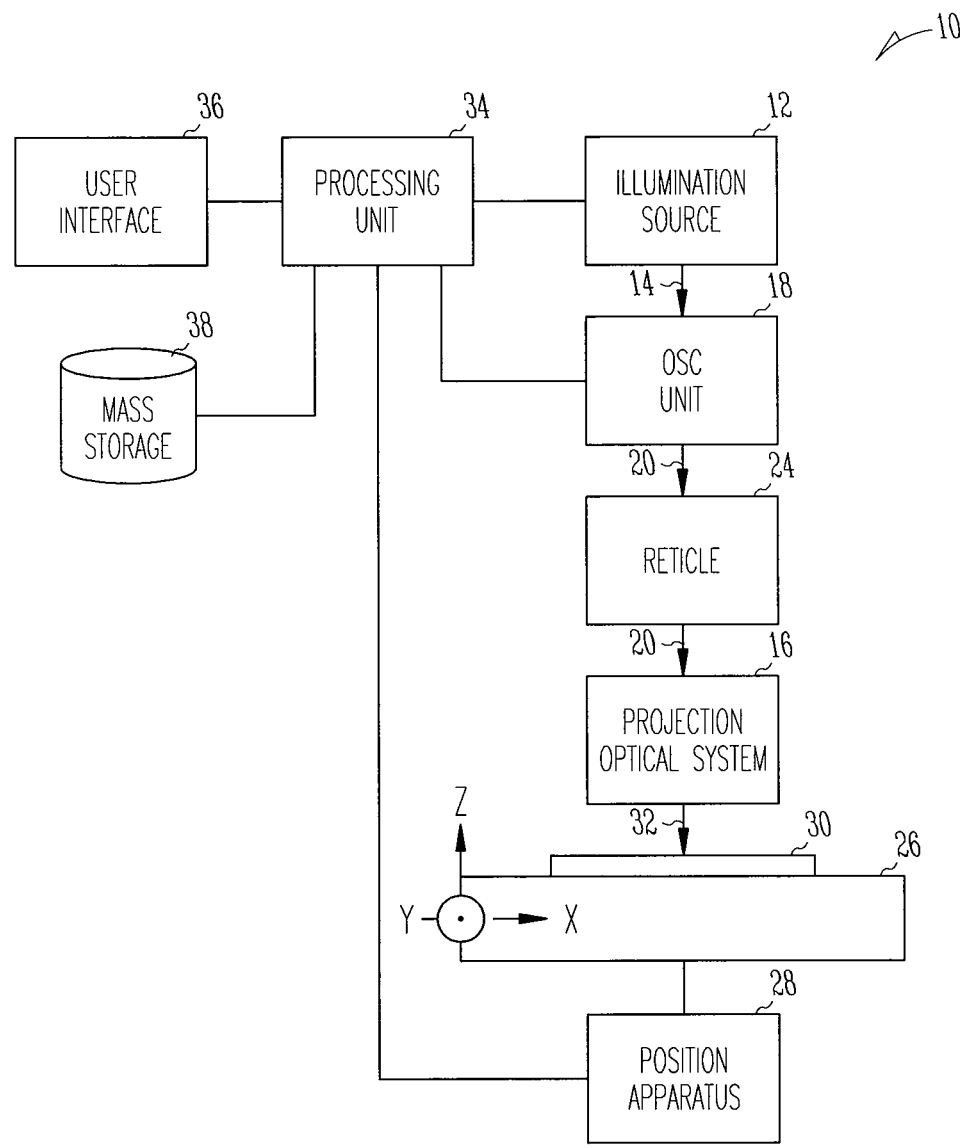
FIG. 1 is a diagrammatic block view of a photolithographic apparatus, according to various embodiments.

FIG. 1 is a diagrammatic block view of a photolithography apparatus 10, according to various embodiments. The apparatus 10 includes an illumination source 12 that is configured to emit illumination radiation 14 that may be used for photolithographic imaging. Accordingly, the illumination source 12 may be configured to generate the illumination radiation 14 in the deep ultraviolet (DUV) portion of the spectrum, and may include sources such as an excimer laser. Suitable excimer laser devices may include a xenon-fluoride (XeF) device that emits radiation at a wavelength of about 351 nanometers (nm), a xenon-chloride (XeCl) device that emits radiation at a wavelength of about 308 nm, a krypton-fluoride (KrF) device that emits radiation at a wavelength of about 248 nanometers (nm), and an argon-fluoride (ArF) device that emits radiation at a about 193 nm wavelength. Other suitable illumination sources may include mercury-arc devices having an emission spectrum between about 365 nm to about 257 nm, although more specific spectral lines may be selected. In addition to the foregoing illumination sources, still other sources configured to emit radiation at other wavelengths may also be used. In some embodiments, illumination source 12 may be configured to provide, in conjunction with a patterning tool such as reticle 24, a desired diffraction pattern, as will be discussed in greater detail below.

An optical shaping and conditioning (OSC) unit 18 may be positioned to receive the illumination radiation 14 generated by the illumination source 12. In general terms, the OSC unit 18 may be configured to provide off-axis illumination 20 corresponding to a selected illumination mode. For example, the OSC unit 18 may be configured to operate in a dipole-type illumination mode, an annular illumination mode, a two-pole illumination mode, a four pole illumination mode, or still other illumination modes using various diffractive optical elements (DOE). The OSC unit 18 may also include still other optical devices that are configured to produce off-axis illumination 20 having a desired intensity and/or distribution. Accordingly, the OSC unit 18 may be configured to accommodate a variety of diffractive optical elements (DOEs) that may be interchangeably positioned along an optical axis of the apparatus 10, so that the illumination radiation 14 is incident on a selected DOE. The OSC unit 18 may also include an optical beam interrupter that is configured to interrupt the illumination radiation 14. The OSC unit 18 will be discussed in greater detail below.

In operation, the reticle 24 may be suitably positioned to receive the off-axis illumination 20 from the OSC unit 18 and to provide diffraction patterns 20. The reticle 24 may be patterned with feature geometries corresponding to features to be formed in a semiconductor device. Accordingly, the reticle 24 may include an optically transmissive material (not shown in FIG. 1), which may comprise fused quartz, or other suitable materials, such as soda-lime glass, or borosilicate glass. The reticle 24 may also include various optical attenuation areas (also not shown in FIG. 1) formed from various compounds that may include selected combinations of chromium, oxygen and nitrogen. The optical attenuation areas may also include selected combinations of molybdenum, silicon, oxygen and nitrogen. Still other features may be formed on the reticle 24 to assist in the formation of desired features on the semiconductor device, including sub-resolution optical compensation regions.

The photolithography apparatus 10 may also include a projection optical system ("POS") 16 that receives the diffraction patterns 20 created by the OSC 18 and reticle 24, and that is configured to convert the diffraction patterns into patterned radiation 32 (which may sometimes be referred to as the "real wafer" image, at least with respect to "production" patterned radiation; according to various embodiments, the real wafer image may be a 4-5× reduction from the "reticle" image). The POS 16 may therefore include a combination of optical elements positioned in an abutting relationship, or positioned at suitable relative distances, or a combination of abutting elements and spaced-apart elements. Although FIG. 1 shows only the POS 16, it is understood that other optical systems may also be positioned within the photolithography apparatus 10, which may include optically transmissive and/or optically-reflective elements.

The photolithography apparatus 10 may further include a translation stage 26 that is operably coupled to a positioning apparatus 28 that is configured to move the translation stage 26 in at least one of three mutually orthogonal directions (e.g., the x, y and z directions shown in FIG. 1). In various embodiments, the positioning apparatus 28 may include one or more stepper motors, or other similar devices, that are configured to move the translation stage 26 in at least one of three mutually orthogonal directions. The translation stage 26 may also include a chuck (not shown in FIG. 1) that is configured to retain a semiconductor article 30 on the translation stage 26 while the article 30 is exposed to patterned radiation 32. In this regard, the semiconductor article 30 may include an in-process semiconductor wafer, or any other semiconductor material that may be subject to imaging in a photolithographic process. The translation stage 26 may also be configured to incrementally move (e.g., 'step') the article 30 so that a plurality of areas on the article 30 may be repetitively exposed to the patterned radiation 32. In various embodiments, the reticle 24 and the translation stage 26 both move during an exposure to scan across an image. In various embodiments, the translation stage 26 also moves to repeat an exposure pattern across multiple exposure fields.

Still referring to FIG. 1, the photolithography apparatus 10 may also include a processing unit 34 that may be operably coupled to the illumination source 12, the OSC unit 18 and the positioning apparatus 28. The processing unit 34 may include any computing device that is configured to receive data and programming instructions, and to process the data according to the programming instructions. The processing unit 34 may be operably coupled to a user interface 36 that may be configured to communicate system information to a system operator, receive instructions from the system operator, and to communicate the received instructions to the processing unit 34. Accordingly, the user interface 36 may include a display device, such as a touch screen display, a pointing device, such as a mouse, a keyboard, or still other devices. A mass storage device 38 may also be operably coupled to the processing unit 34 to store data and/or instructions. Although various portions of the photolithography apparatus 10 of FIG. 1 have been described above, it is understood that various rearrangements of the above-described portions are possible. It is also understood that various portions of the photolithography apparatus 10 may also be omitted without significantly departing from the teaching of the present disclosure.

Figure 2:
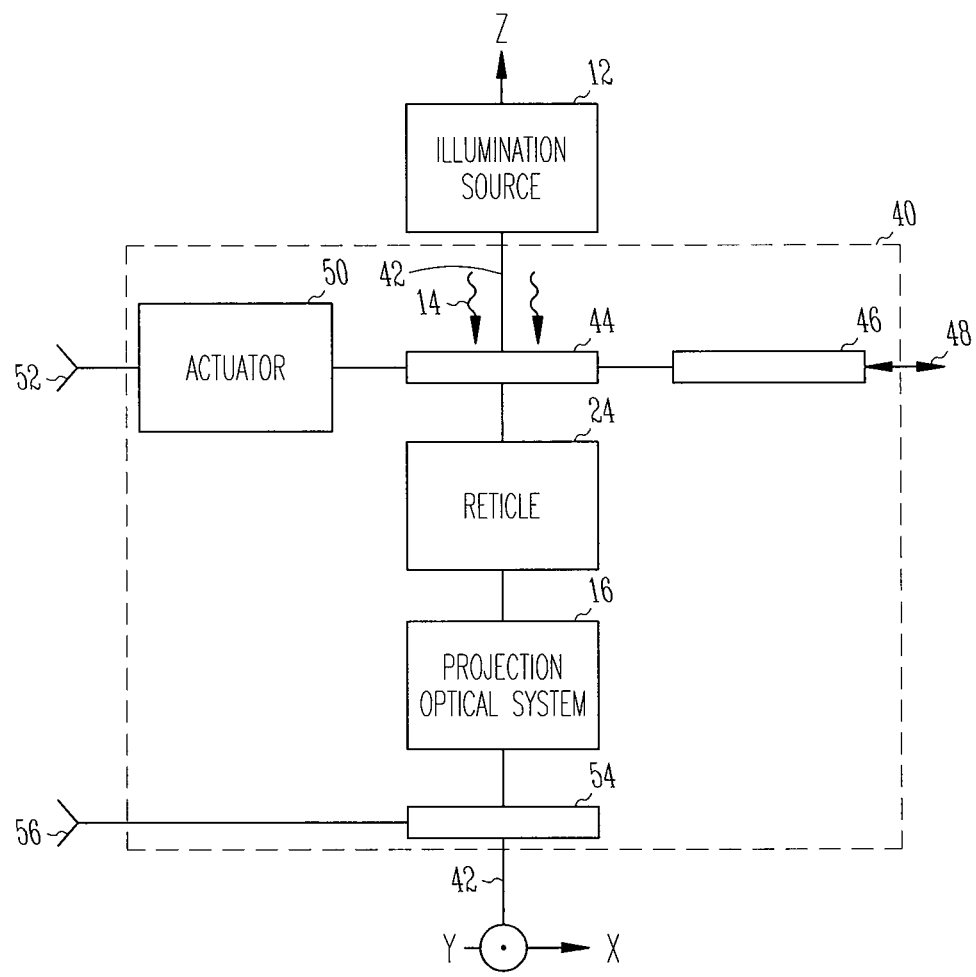
FIG. 2 is a diagrammatic block view of an optical path, according to various embodiments.

FIG. 2 is a diagrammatic block view of an optical path 40 according to various embodiments. The optical path 40 may be similar to or identical to a portion of the photolithography apparatus 10 of FIG. 1 including the OSC 18, the reticle 24 and the POS 16, in some embodiments. The optical path 40 may be positioned on an optical axis 42 in the photolithography apparatus 10 between the illumination source 12 and other portions of the photolithography apparatus 10, such as the article 30 and the translation stage 26.

Briefly, and in general terms, in operation, portions of the POS 16 may not have energy passing through it, or the distribution of the energy may be unevenly distributed, which is believed to lead to non-uniform heating within the POS 16. This, in turn, may lead to undesirable aberrations within the POS 16. Accordingly, in some embodiments, the optical path 40 may include a first diffractive optical element (DOE) 44 and a second diffractive optical element (DOE) 46 that may be configured to be moved in a direction 48 that may be approximately perpendicular to the optical axis 42. The first DOE 44 and the second DOE 46 may be physically linked so that the first DOE 44 and the second DOE 46 may be sequentially moved into optical alignment with the optical axis 42. Accordingly, an actuator 50 may be coupled to the processing unit 34 (FIG. 1) so that signals 52 may be received by the actuator 50 to move the first DOE 44 and the second DOE 46 into optical alignment with the optical axis 42.

In accordance with various embodiments, the first DOE 44 may be configured to provide, in conjunction with the reticle 24, a first (e.g., "production") diffraction pattern, wherein the POS 16 is configured to convert the "production" diffraction pattern into patterned radiation that can be projected onto the article 30 (FIG. 1). The second DOE 46 may be configured to provide, in conjunction with the reticle 24, a second (e.g., "non-production") diffraction pattern, such as one that is complementary to the production diffraction pattern, so that portions of the POS 16 not exposed to illumination radiation when the first DOE 44 is aligned with the optical axis 42 may then be exposed to illumination radiation after the second DOE 46 is moved into optical alignment with the optical axis 42, so that various optical aberrations due to non-uniform lens heating may be reduced, as will be described in detail below. Although FIG. 2 shows a pair of diffractive optical elements (e.g., the first DOE 44 and the second DOE 46), it is understood that more than two DOEs may also be used in some embodiments.

The optical path 40 may also include an optical beam interrupter 54 that may be configured to interrupt illumination radiation extending along the optical axis 42. The optical beam interrupter 54 may be configured to receive signals 56 from the processing unit 34 (as shown in FIG. 1) to actuate the optical beam interrupter 54 to an open state, wherein illumination radiation is transmitted through the optical beam interrupter 54 without significant attenuation, and a closed state, wherein projection of illumination radiation along the optical axis 42 is interrupted, and completely attenuated. In various embodiments, the optical beam interrupter 54 may include a mechanical shutter that is coupled to an actuator configured to rapidly move the mechanical shutter between the open and closed states. In various alternative or additional embodiments, the optical beam interrupter 54 may include an optoelectronic device having no moving parts. For example, the optical beam interrupter 54 may comprise a device that operates according to the Kerr electro-optic effect, wherein a Kerr cell having a material with a suitable Kerr constant is positioned between actuating electrodes. Accordingly, upon application of a suitable bias voltage to the electrodes, the Kerr cell may be moved from the open state to the closed state to interrupt illumination radiation as it extends along the optical axis 42.

Figure 3:
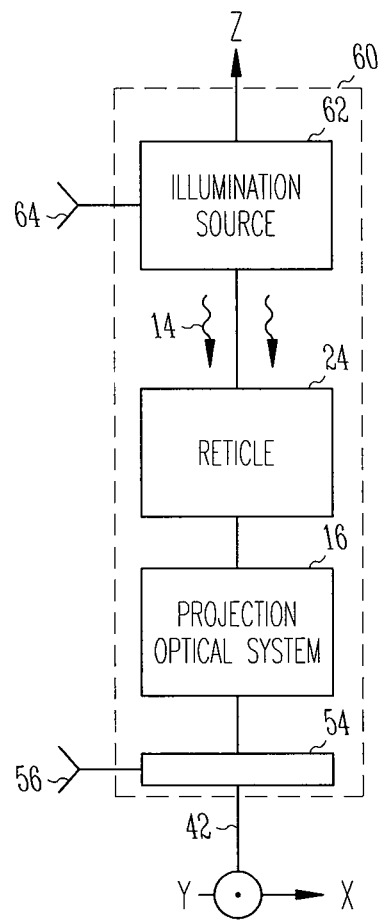
FIG. 3 is a diagrammatic block view of another optical path, according to various embodiments.

FIG. 3 is a diagrammatic block view of an optical path 60, according to other various embodiments. Various portions of the optical path 60, which may be similar to or identical to the optical path 40, have been discussed in detail previously. Accordingly, in the interest of brevity, such portions may not be discussed further.

The optical path 60 may include an illumination source 62 optically aligned with the optical axis 42. In various embodiments, the illumination source 62 may include a micro-electromechanical system (MEMS) that includes a programmable array of micro-mirrors that may be configured to provide, in conjunction with the reticle 24, a plurality of diffraction patterns. For example, a first, (e.g., production) diffraction pattern may correspond to a selected illumination mode for projection onto the article 30 (shown in FIG. 1). A second (e.g., non-production) diffraction pattern may be configured to be complementary to the first diffraction pattern, such as to at least partially compensate the non-uniform heating effected by the first diffraction pattern. Accordingly, the illumination source 62 may be configured to receive signals 64 from the processing unit 34 (shown in FIG. 1) so that the micro-mirror array may be configured to provide the first diffraction pattern, the second diffraction pattern, or still other diffraction patterns. One suitable illumination source that incorporates a micro-mirror array may include the FLEXRAY micro-mirror illumination source, available from ASML Netherlands B.V., Veldhoven, The Netherlands, although other illumination sources may also be used. The optical path 60 may also include an optical beam interrupter 54 that is configured to interrupt illumination radiation that is projected along the optical axis 42.

Figure 4:
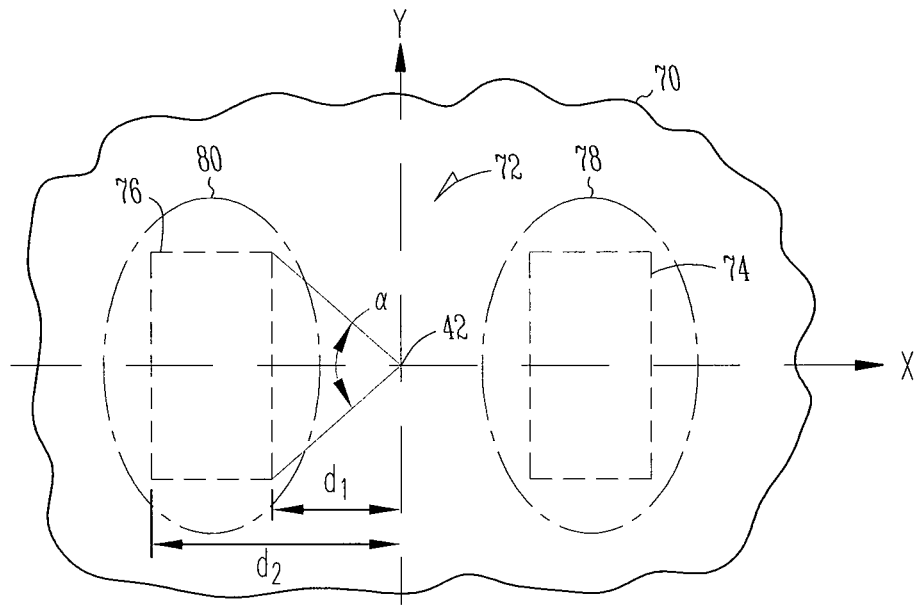
FIG. 4 is a partial plan view of a portion of a POS that is exposed to a first diffraction pattern.

FIG. 4 is a partial plan view of a portion 70 of a POS (such as a piece of a lens) that will be used to describe non-uniform heating effects on the portion 70. The portion 70 is exposed to a first diffraction pattern 72. The first diffraction pattern 72 may include a pair of spaced-apart illuminated regions 74 and 76. Although the spaced-apart illuminated regions 74 and 76 are shown approximately rectangular in shape, it is understood that the spaced-apart illuminated regions 74 and 76 may also be approximately arcuate in configuration, and may include, for example, a 60-X, 0.9/0.7 illumination dipole, that subtends an angle α of approximately 60 degrees, and extends radially between sigma values of approximately $d_1=0.7$ and $d_2=0.9$. Alternatively, a plurality of other illumination configurations may also be used. Further, although FIG. 4 shows a pair of spaced-apart illuminated regions 74 and 76, it is understood that FIG. 4 depicts a numerical aperture (NA) of approximately one, so that the spaced-apart illuminated regions 74 and 76 may also include other higher-order regions that are spaced apart and positioned beyond the spaced-apart illuminated regions 74 and 76 and along the x-axis of FIG. 4. In various embodiments, the photolithography apparatus 10 operates with a NA from 0.64 to 1.35. In any case, when the spaced-apart illuminated regions 74 and 76 are projected onto a portion 70 of the POS for an exposure time $t_1$ (that generally corresponds to an exposure time for the article 30 of FIG. 1), respective thermally-affected zones 78 and 80 are often generated within the portion 70. The thermally-affected zones 78 and 80 may generally include a temperature gradient, and an average temperature that is greater than other locations of portion 70 that are external to the thermally-affected zones 78 and 80. Accordingly, the extent of the coverage of thermally-affected zones 78 and 80, as well as the magnitude of thermal gradients and average temperatures of the thermally-affected zones 78 and 80, are generally dependent upon the length of the exposure time $t_1$. The spaced-apart illuminated regions 74 and 76 may also include other higher-order regions that are outside of an NA cutoff. These regions may affect lens heating and aberrations.

Figure 5:
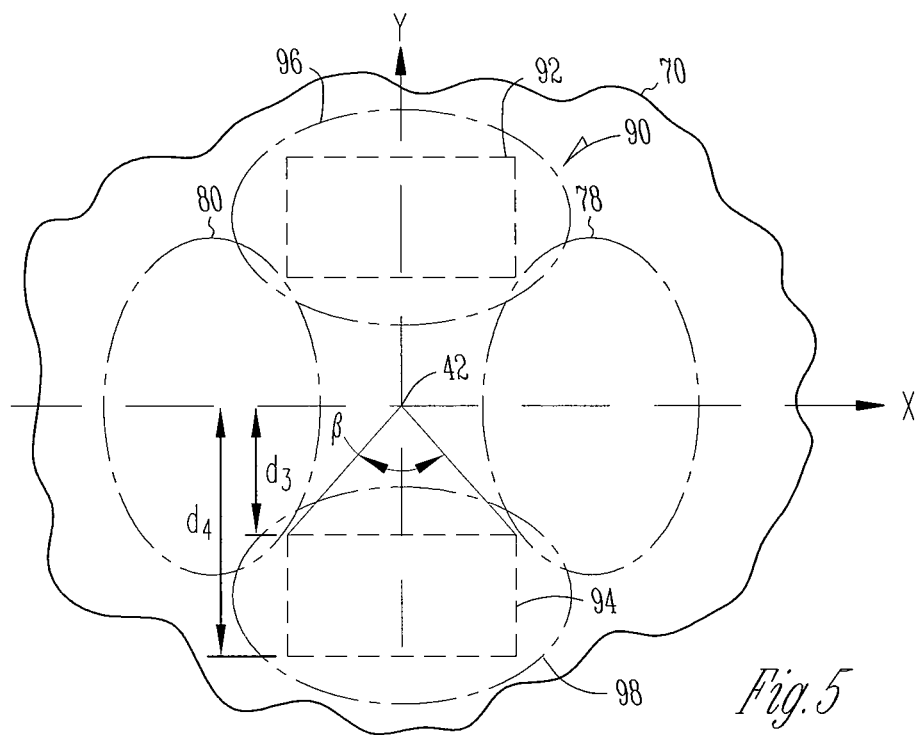
FIG. 5 is another partial plan view of the portion of the POS that is exposed to a second diffraction pattern.

FIG. 5 is another partial plan view of the portion 70 that will be used to describe thermal compensation of the non-uniform heating effects of the first diffraction pattern 72 (FIG. 4) on the portion 70. As shown in FIG. 5, a second diffraction pattern 90 may be projected onto portion 70. The second diffraction pattern 90 includes a pair of spaced-apart illuminated regions 92 and 94. The second diffraction pattern 90 is complementary to the first diffraction pattern 72 (see FIG. 4), such as to compensate the portion 70 of POS by exposing illumination radiation to other locations of the portion 70 not previously exposed to the first diffraction pattern 72 (as shown in FIG. 4, and represented by the thermally-affected zones 78, 80). Accordingly, the second diffraction pattern 90 may include, for example, a 120-Y, 0.9/0.7 illumination dipole, that subtends an angle β of approximately 120 degrees, and extends radially between sigma values of approximately $d_3=0.7$ and $d_4=0.9$. Alternatively, other illumination configurations may also be used. Although FIG. 5 shows a pair of spaced-apart illuminated regions 92 and 94, it is understood that FIG. 5 also depicts a numerical aperture (NA) of approximately one, so that the spaced-apart illuminated regions 92 and 94 may also include other higher-order regions that are spaced apart and positioned beyond the illuminated regions 92 and 94 along the y-axis. In various embodiments, the second diffraction pattern 90 is not fully complementary to the first diffraction pattern 72, and does not expose regions adjacent to regions exposed by the first diffraction pattern 72. In various embodiments, aberration sensitivities of different regions of the POS are mapped, and specific regions of the POS are selectively exposed to achieve a particular aberration response. In various embodiments, the second diffraction pattern 90 is targeted to regions of the POS that result in an aberration response opposite to an aberration response of the first diffraction pattern 72. The targeted second diffraction pattern 90 may substantially cancel aberrations resulting from the first diffraction pattern 72 and reduce an aberration signature resulting from heating of the POS. The targeted second diffraction pattern 90 may not reduce thermal gradients in the POS, and may result in additional thermal gradients.

The spaced-apart illuminated regions 92 and 94 are projected onto portion 70 for an exposure time $t_2$ after the first diffraction pattern 72 (see FIG. 4) is interrupted. Accordingly, thermally-affected zones 96 and 98 may be generated substantially adjacent the thermally-affected zones 78 and 80, and operate to compensate the portion 70 and reduce the undesirable effect of non-uniform lens heating. According to one or more embodiments, exposure time $t_2$ may be approximately equal to a time to change the article 30 (for swapping in the next article to be patterned, for example), which may be less than the time $t_1$. Such an embodiment may help to avoid any reduction in throughput of the apparatus. However, in various other embodiments, the exposure time $t_2$ may be approximately equal to the time $t_1$. Alternatively, the exposure time $t_2$ may be selected to be greater than the time $t_1$, such as to adjust the thermally-affected zones 96 and 98 to have average temperatures approximately equal to an average temperature of the thermally-affected zones 78 and 80. The exposure time $t_2$ may also be suitably adjusted to reduce at least one temperature gradient within or adjacent the thermally-affected zones 78, 80, 96 and 98 so that thermally-induced optical variations in the portion 70 may be reduced.

In the foregoing description, it is understood that generating the first thermally-affected zones may comprise inducing at least one optical aberration in a portion of a POS, and generating the second thermally-affected zones may comprise reducing the at least one optical aberration, and that generating the first thermally-affected zones may also comprise generating a thermal gradient in the portion, and generating the second thermally-affected zones may comprise reducing the thermal gradient. It is also understood that a first average temperature in the portion exposed to the first diffraction pattern may be altered by exposing the portion to a second diffraction pattern, thereby generating the second thermally-affected zones to alter a second average temperature in the portion. Further, a second average temperature may be approximately equal to the first average temperature. In various embodiments, the second thermally-affected zones may not reduce thermal gradients in the POS, and the second average temperature may not be equal to the first average temperature.

Figure 6:
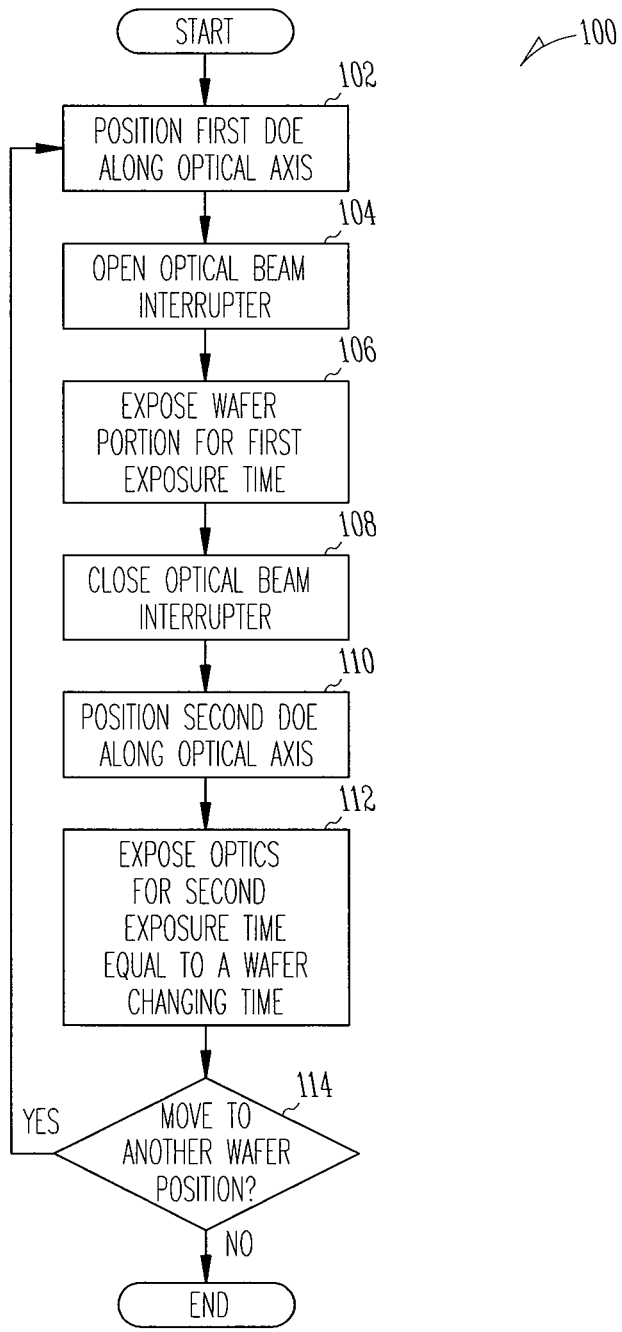
FIG. 6 is a flowchart that describes a method of thermal compensation in a photolithography apparatus, according to various embodiments.

FIG. 6 is a flowchart that will be used to describe a method 100 of thermal compensation in a photolithography apparatus, according to various embodiments. With reference again also to FIGS. 1 through 5, at 102, the first diffractive optical element (DOE) 44 may be positioned along the optical axis 42 of the photolithographic apparatus 10. At 104, the optical beam interrupter 54 is actuated to the open state, so that a portion 70 of POS 16 may be exposed to the first diffraction pattern 72. The article 30 may then be exposed for a first exposure time $t_1$, as shown at 106. At 108, the optical beam interrupter 54 may be actuated to the closed state. While the optical beam interrupter 54 is maintained in the closed state, the second diffractive optical element 46 may be positioned along the optical axis 42 of the photolithographic apparatus 10, as shown at 110. At 112, portion 70 of POS 16 may be exposed to the second diffraction pattern 90 for a second exposure time $t_2$, such as to at least partially compensate for a thermal effect of the first diffraction pattern 72. The second exposure time $t_2$ is equal to a wafer changing time according to various embodiments. The optical beam interrupter 54 is maintained in the closed state during the second exposure time $t_2$ such that the article 30 is not exposed to the second diffraction pattern 90. At decision block 114, if other portions of the article 30 are to be exposed, the method 100 may return to 102. Otherwise, the method 100 ends.

Figure 7:
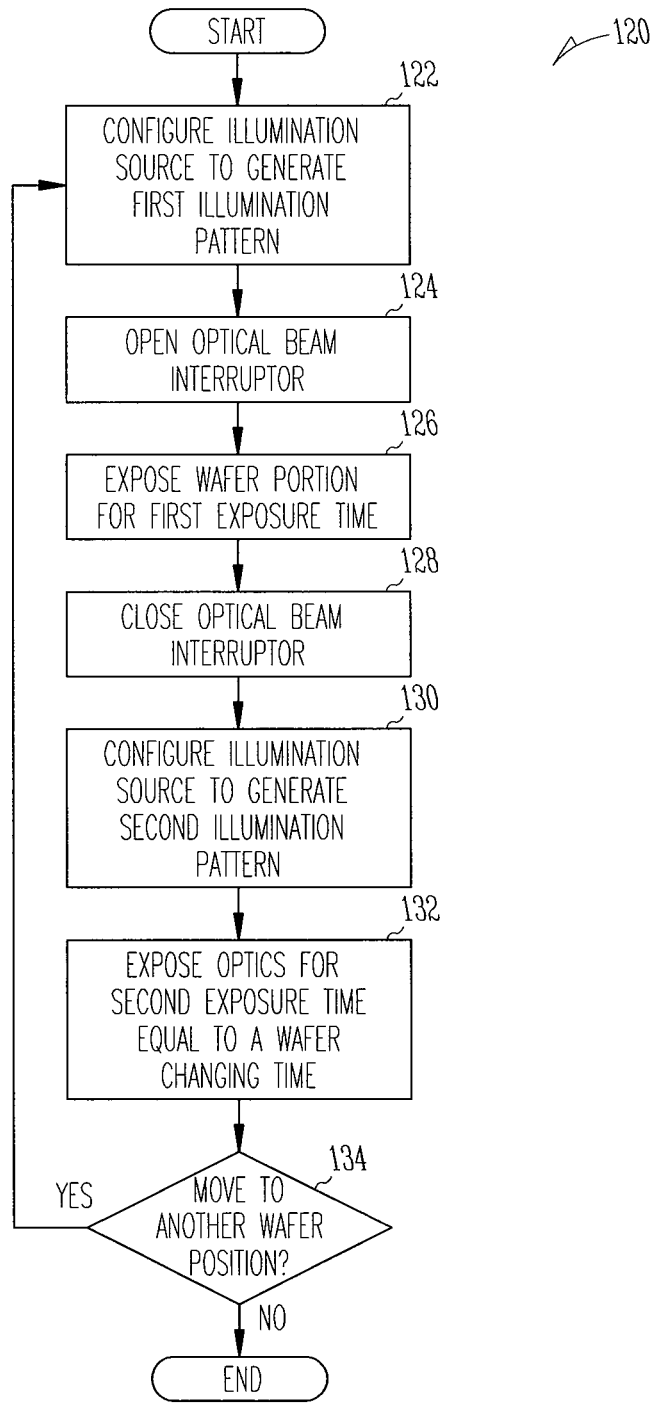
FIG. 7 is another flowchart that describes a method of thermal compensation in a photolithography apparatus, according to various embodiments.

FIG. 7 is another flowchart that will be used to describe another method 120 of thermal compensation in a photolithography apparatus, according to various embodiments. With reference still to FIGS. 1 through 5, at 122, the illumination source 62 may be configured by signals 64 communicated from the processing unit 34 to the illumination source 62 to provide, in conjunction with the reticle 24, a first diffraction pattern 72. For example, the illumination source 62 may be configured to provide, in conjunction with the reticle 24, a first diffraction pattern 72 that includes the 60-X, 0.9/0.7 illumination dipole, or still other patterns. At 124, the optical interrupter 54 may be actuated to the open state, so that the article 30 may be exposed for a first exposure time $t_1$, as shown at 126. At 128, the optical beam interrupter 54 may be actuated to the closed state. At 130, the illumination source 62 may again be configured by signals 64 to provide, in conjunction with the reticle 24, a second diffraction pattern 90, such as to at least partially compensate for the thermal effect of the first diffraction pattern 72. At 132, the portion 70 of POS 16 may be exposed to the second diffraction pattern 90 for a second exposure time $t_2$. The second exposure time $t_2$ is equal to a wafer changing time according to various embodiments. The optical beam interrupter 54 remains in the closed state for a second exposure time $t_2$ such that the article 30 is not exposed to the second diffraction pattern 90. At decision block 134, if other portions of the article 30 are to be exposed, the method 120 may return to 122. Otherwise, the method 120 ends.

Although specific embodiments have been illustrated and described herein, it should be appreciated that any arrangement calculated to achieve the same purpose may be substituted for various embodiments shown. This disclosure is intended to cover any and all adaptations or variations of various embodiments. Combinations of the above embodiments, and other embodiments not specifically described herein, will be apparent upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A photolithographic apparatus, comprising an optical path configured to:
   provide a first diffraction pattern to a portion of an optical system, wherein the first diffraction pattern is configured to expose a semiconductor article and induce a thermal gradient in the portion;
   provide a second diffraction pattern to the portion of the optical system after providing the first diffraction pattern, wherein the semiconductor article is not exposed to the second diffraction pattern and the second diffraction pattern is configured to reduce the thermal gradient in the portion, and
   wherein the optical path comprises an illumination source that includes a micro-electromechanical micro-mirror array that is configurable to provide, in conjunction with a reticle, both the first diffraction pattern and the second diffraction pattern.

2. The apparatus of claim 1, wherein the optical path comprises an illumination source, and an optical shaping and conditioning (OSC) unit comprising a first diffractive optical element and a second diffractive optical element, wherein the first diffraction pattern is provided by the first diffractive optical element in conjunction with a reticle, and the second diffraction pattern is provided by a second diffractive optical element in conjunction with the reticle.

3. The apparatus of claim 1, comprising a processing unit configured to provide configuration instructions to the illumination source.

4. The apparatus of claim 1, wherein the optical path comprises a beam interrupter between the optical system and the semiconductor article configurable to an open state and a closed state to interrupt illumination radiation between the optical system and the semiconductor article.

5. The apparatus of claim 4, comprising a translation stage configured to retain the semiconductor article, wherein the semiconductor article is exposed to the illumination radiation when the beam interrupter is configured in the open state.

6. The apparatus of claim 1, wherein the first diffraction pattern and the second diffraction pattern include at least one of a dipole pattern, an annular illumination pattern and a four-pole illumination pattern.

7. A method, comprising:
   providing a first diffraction pattern onto a portion of an optical system, wherein a semiconductor article is imaged using the first diffraction pattern, wherein providing the first diffraction pattern comprises configuring a micro-electromechanical array of micro-mirrors in a first configuration, the first diffraction pattern configured to induce an optical aberration from a thermal gradient in the optical system; and
   providing a second diffraction pattern onto the portion of the optical system, wherein providing the second diffraction pattern comprises configuring the micro-electromechanical array of micro-mirrors in a second configuration, the second diffraction pattern configured to reduce the thermal gradient in the optical system, wherein the semiconductor article is not exposed to the second diffraction pattern.

8. The method of claim 7, wherein providing the first diffraction pattern comprises moving a first diffractive optical element into optical alignment with an optical axis of the optical system, and wherein providing the second diffraction pattern comprises moving a second diffractive optical element into optical alignment with the optical axis of the optical system.

9. The method of claim 7, wherein providing the first diffraction pattern comprises using an illumination source in a first illumination mode, and wherein providing the second diffraction pattern comprises using the illumination source in a second illumination mode.

10. The method of claim 7, wherein providing the first diffraction pattern comprises providing the first diffraction pattern for a first time, and wherein providing the second diffraction pattern comprises providing the second diffraction pattern for a second time that is different from the first time.

11. The method of claim 7, wherein providing the first diffraction pattern comprises providing a first illumination dipole and wherein providing the second diffraction pattern comprises providing a second illumination dipole.

12. The method of claim 7, wherein providing the first diffraction pattern comprises providing a first annular illumination pattern and wherein providing the second diffraction pattern comprises providing a second annular illumination pattern.

13. The method of claim 7, wherein providing the first diffraction pattern comprises providing a first four-pole illumination pattern and wherein providing the second diffraction pattern comprises providing a second four-pole illumination pattern.

14. A method, comprising:
providing a first diffraction pattern onto a portion of an optical system, wherein providing the first diffraction pattern generates spaced-apart first thermally-affected zones causing a thermal gradient in the portion, wherein providing the first diffraction pattern comprises configuring a micro-electromechanical micro-mirror array illumination source to provide, in conjunction with a reticle, the first diffraction pattern; and
after providing the first diffraction pattern, providing a second diffraction pattern onto the portion, wherein providing the second diffraction pattern generates second thermally-affected zones in the portion reducing the thermal gradient, wherein providing the second diffraction pattern comprises configuring the micro-electromechanical micro-mirror illumination source to provide, in conjunction with the reticle, the second diffraction pattern;
wherein the first thermally-affected zones induce at least one optical aberration in the portion, and wherein the second thermally-affected zones reduce the at least one optical aberration.

15. The method of claim 14, wherein providing the first diffraction pattern onto the portion comprises providing illumination radiation through a first diffractive optical element, and wherein providing the second diffraction pattern onto the portion comprises providing illumination radiation through a second diffractive optical element.

16. The method of claim 14, wherein providing the first diffraction pattern comprises moving a first diffractive optical element into optical alignment with the optical system, and providing the second diffraction pattern comprises moving a second diffractive element into optical alignment with the optical system.

17. The method of claim 14, wherein providing the first diffraction pattern alters a first average temperature of the first thermally-affected zones, and providing the second diffraction pattern alters a second average temperature of the second thermally-affected zones.

18. The method of claim 17, wherein the second average temperature is approximately equal to the first average temperature.

19. The method of claim 14, wherein the second thermally-affected zones are not adjacent to the first thermally-affected zones.

20. The method of claim 14, wherein the second thermally-affected zones are substantially adjacent to the first thermally-affected zones.

21. The method of claim 14, further comprising:
interrupting illumination radiation between the optical system and a semiconductor article; and
providing the second diffraction pattern to the portion of the optical system after providing the first diffraction pattern when the illumination radiation between the optical system and the semiconductor article is interrupted.

* * * * *